(12) United States Patent
Straboni

(10) Patent No.: US 7,563,404 B2
(45) Date of Patent: Jul. 21, 2009

(54) METHOD FOR THE PRODUCTION OF SEMICONDUCTOR GRANULES

(75) Inventor: Alain Straboni, Buxerolles (FR)

(73) Assignees: Centre National de la Recherche Scientifique, Paris (FR); Universite de Poitiers, Poitiers (FR)

( * ) Notice: Subject to any disclaimer, the term of this patent is extended or adjusted under 35 U.S.C. 154(b) by 76 days.

(21) Appl. No.: 10/553,049

(22) PCT Filed: Apr. 9, 2004

(86) PCT No.: PCT/FR2004/050152

§ 371 (c)(1),
(2), (4) Date: Jun. 15, 2006

(87) PCT Pub. No.: WO2004/091767

PCT Pub. Date: Oct. 28, 2004

(65) Prior Publication Data

US 2007/0023979 A1    Feb. 1, 2007

(30) Foreign Application Priority Data

Apr. 14, 2003 (FR) .................. 03 04675

(51) Int. Cl.
*B28B 3/02* (2006.01)
(52) U.S. Cl. .......... 264/614; 264/299; 264/314
(58) Field of Classification Search .......... 264/299, 264/319, 614
See application file for complete search history.

(56) References Cited

U.S. PATENT DOCUMENTS 4,759,887 A    7/1988 Geissler et al.
4,849,033 A *  7/1989 Vander Sande et al. ....... 438/54
5,431,127 A *  7/1995 Stevens et al. ................. 117/75
2007/0178675 A1* 8/2007 Straboni ..................... 438/493

FOREIGN PATENT DOCUMENTS

| DE | 2258305 | 5/1974 |
|---|---|---|
| DE | 19859288 | 6/2000 |
| EP | 0230617 | 8/1987 |
| FR | 2038715 | 1/1971 |
| FR | 2479276 | 10/1981 |
| FR | 2814757 | 4/2002 |
| WO | WO 00/68999 | 11/2000 |

OTHER PUBLICATIONS

Santana C. J. et al., "The effects of Processing Conditions on the Density and Microstructure of Hot-Pressed Silicon Powder", Journal of Materials Science, vol. 31, 1996, pp. 4985-4990.*
Chatterjee S. et al., "A miniature PTC thermistor based sensor element fabricated by tape casting technique", Sensors and Actuators B, Elsevier Sequoia S.A., Lausanne, CH, vol. 60, No. 2-3, Nov. 23, 1999, pp. 155-160.
Selvan R. K. et al, "Combustion synthesis of CuFe2O4", Materials Research Bulletin, Elsevier Science Publishing, New York, US, vol. 38, No. 1, Jan. 1, 2003, pp. 41-54.

* cited by examiner

*Primary Examiner*—Eric Hug
*Assistant Examiner*—Russell J Kemmerle, III
(74) *Attorney, Agent, or Firm*—Howard IP Law Group, P.C.

(57) ABSTRACT

The invention relates to a method for the production of semiconductor granules comprising a step in which semiconductor powders are sintered and/or melted. The powders are nanometric and/or micrometric sized.

6 Claims, 3 Drawing Sheets

METHOD FOR THE PRODUCTION OF SEMICONDUCTOR GRANULES

This application is the national stage application under 35 U.S.C. § 371 of the International Application No. PCT/FR2004/050152 and claims the benefit of French Application No. 03/04675, filed Apr. 14, 2003 and Int'l. Application No. PCT/FR2004/050152, filed Apr. 9, 2004, the entire disclosures of which are incorporated herein by reference in their entireties.

The present invention relates to the field of semiconductor materials, and in particular, but not exclusively, semiconductor granules usable to feed a melt intended for the forming of ingots of a semiconductor material, such as silicon.

Conventionally, single-crystal silicon or polysilicon ingots are obtained by growth or stretching from silicon melts. Such melts are fed with silicon granules or pieces of a size greater than 1 mm. Indeed, if a silicon melt is fed with smaller particles, the particles very uneasily incorporate to the melt, which adversely affects the smooth progress of the process.

A conventional example of granule manufacturing is the following. In a chemical vapor deposition reactor (CVD), silane $SiH_4$ or trichlorosilane $SiHCl_3$ gas is cracked, that is, heated so that its molecule is broken. Solid silicon is then released and deposits in the form of powders. At the beginning of the process, the obtained powders are very thin, typically on the order of a few tens of nanometers. To have the grains of these powders grow bigger, specific conditions must be implemented, which complexifies the method and equipments. Fluidized bed deposition machines which enable growth of the powder grains up to from one to two millimeters are for example used.

The above-described method is long and consumes a great amount of power. The selfcost of granules is high. Further, this manufacturing process leaves residues in the form of very thin powders, much smaller than one millimeter, unexploited up to now.

An object of the present invention is to provide a method for manufacturing granules adapted to feeding a semiconductor material ingot manufacturing melt, which is fast, inexpensive, and consumes little power.

To achieve this and other objects, the present invention provides a method for manufacturing semiconductor granules intended to feed a semiconductor material manufacturing melt. The method comprises a method of sintering and/or melting of semiconductor powders.

According to an embodiment of the present invention, the granules have a size greater than 1 mm.

According to an embodiment of the present invention, the powders comprise powders of nanometric and/or micrometric size.

According to an embodiment of the present invention, the method comprises a compaction step followed with a thermal processing step.

According to an embodiment of the present invention, the pressure ranges between 10 MPa and 1 GPa and the temperature is greater than 800° C.

According to an embodiment of the present invention, the method comprises a hot pressing step.

According to an embodiment of the present invention, in the hot pressing step, the pressure is lower than 100 MPa and the temperature is greater than 800° C.

According to an embodiment of the present invention, the method comprises a step of placing the powders in a mould.

According to an embodiment of the present invention, the powders are doped semiconductor powders.

According to an embodiment of the present invention, the method comprises a step of anneal or doping of the granules.

The foregoing and other objects, features, and advantages of the present invention will be discussed in detail in the following non-limiting description of specific embodiments in connection with the accompanying drawings, among which:

To manufacture inexpensive granules, within a short time and while consuming little power, the inventor has thought of sintering or melting semiconductor powders.

The used powders for example are powders of nanometric size (from 10 to 500 nm) or micrometric size (from 10 to 500 µm) coming from the CVD reactors. Silicon wafer sawing residues, which also comprise powders of nanometric and micrometric size, may also be used.

The granule manufacturing according to the present invention will now be described in relation with FIGS. 1A to 1F.

Figure 1A:
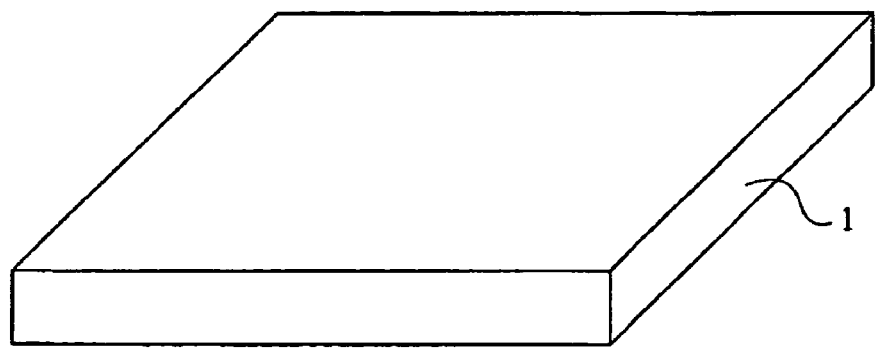
FIGS. 1A to 1F illustrate the manufacturing of granules according to the present invention.

FIG. 1A shows a planar parallelepipedal-shaped support 1. Support 1 is intended to be a compression part and it is formed, for example, with a graphite blade, or another ceramic. To form support 1, silicon nitride $Si_3N_4$, silicon carbide SiC, boron nitride BN, alumina, zirconia, magnesia, etc. may for example be used.

Figure 1B:
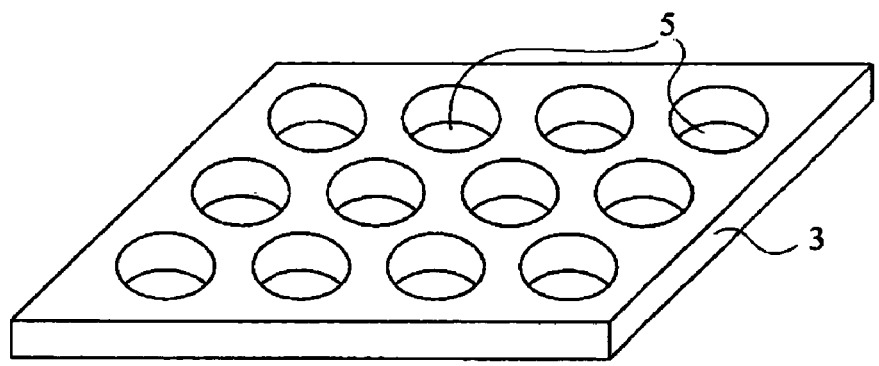

A mould 3 shown in FIG. 1B is placed above support 1 of FIG. 1A. Mould 3 is a plate pierced with openings 5. The openings 5 shown in FIG. 1B have a circular cross-section. Typically, the thickness of mould 3 is on the order of from one to a few millimeters, and the diameter of openings 5 for example ranges between 1 and 5 millimeters.

Figure 1C:
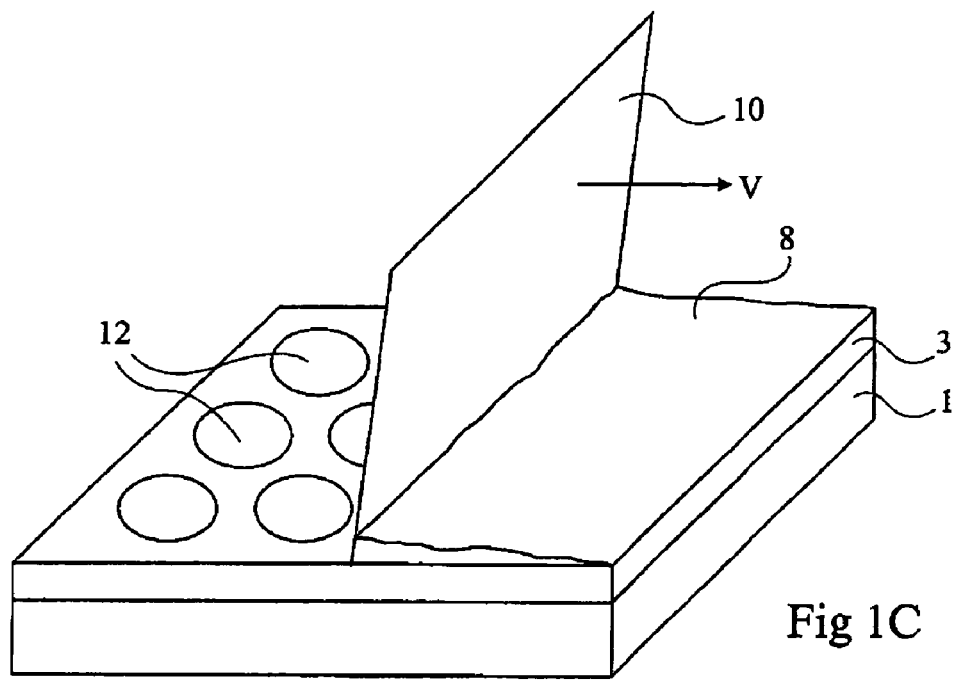

Then, as shown in FIG. 1C, the assembly formed by the superposition of support 1 and of mould 3 is covered with semiconductor material powders 8. Semiconductor powders 8 are scraped by a scraping element 10 in the direction of arrow V. Element 10 scrapes powders 8 and, after passing thereof, openings 5 of mould 3 are filled with powders 12.

Figure 1D:
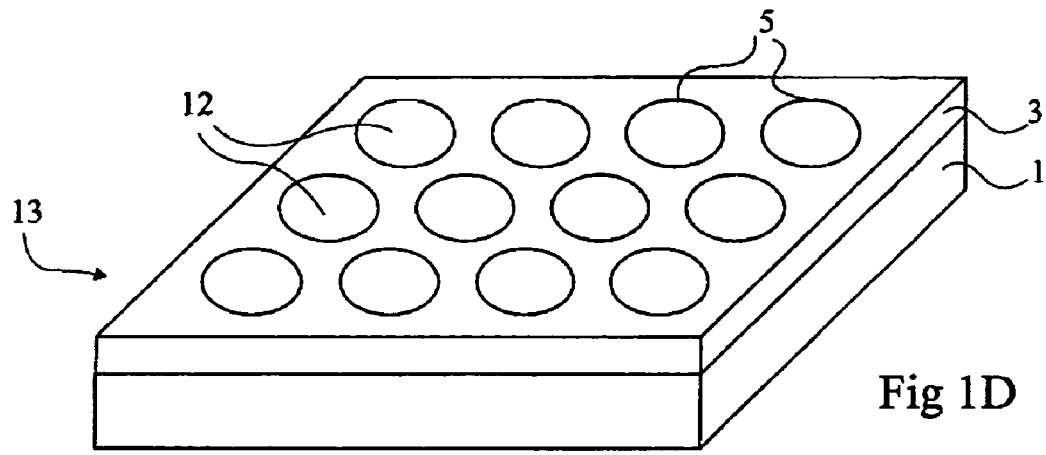
Figure 1E:
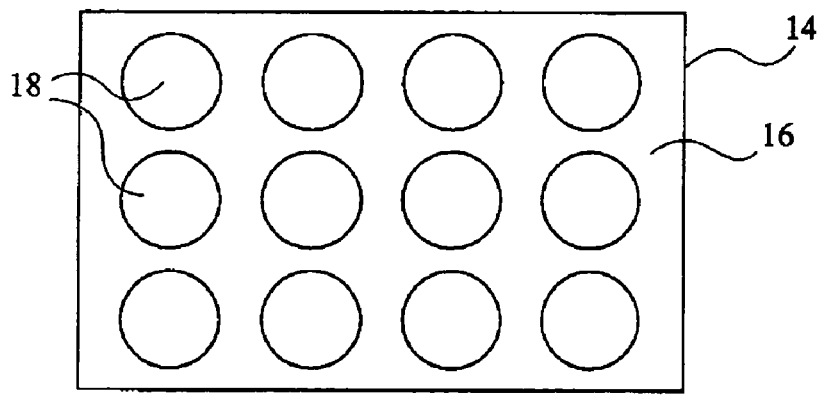

As shown in FIG. 1D, an assembly 13 formed by support 1 topped with mould 3 having its openings 5 filled with powders 12 is obtained.

A plate 14 is placed above assembly 13. Plate 14 may be formed of the same material as support 1. Plate 14 exhibits, on its lower surface shown in FIG. 1E, a planar surface 16 from which are salient protrusions 18 complementary with openings 5 and less high than the openings are deep.

Figure 1F:
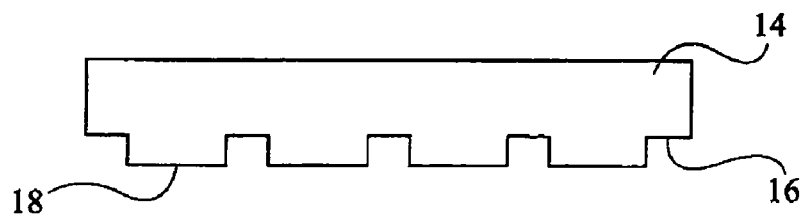

FIG. 1F shows plate 14 in cross-section. Protrusions 18 are formed by cylinder elements of a diameter slightly smaller than openings 5. The position of protrusions 18 is the same as that of openings 5. Plate 14 is placed above assembly 13 of FIG. 1D, so that protrusions 18 are above openings 5, filled with silicon powder 12.

Several embodiments of the method according to the present invention for manufacturing the granules will now be described.

Figures 2A, 2B:
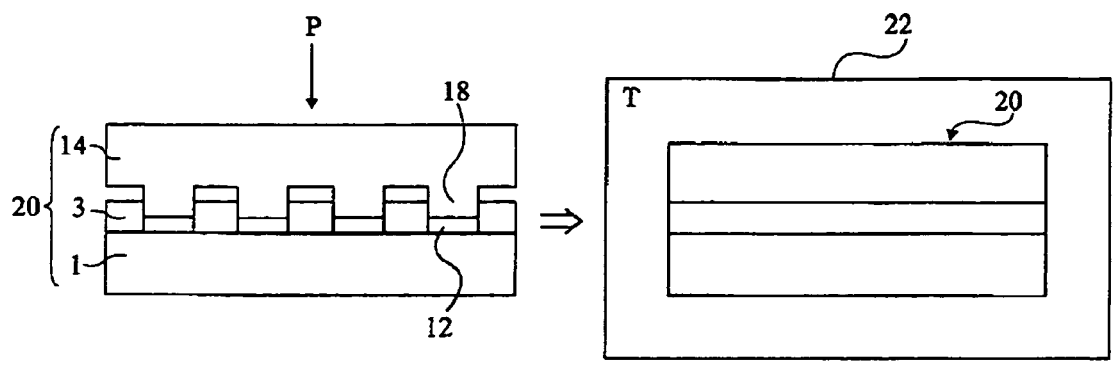
FIGS. 2A and 2B illustrate an embodiment of a method according to the present invention.

FIG. 2A shows in cross-section view an assembly 20 formed by support 1, mould 3 comprising the silicon powders, and plate 14. A pressure P is exerted between elements 1 and 14. Pressure P ensures a compacting of the silicon powders 12 contained in mould 3, protrusions 18 of plate 14 penetrating into openings 5 of mould 3 and compressing the powders. Due to the compacting, a consolidation process starts. After compaction, as illustrated in FIG. 2B, assembly 20 is placed in an anneal furnace 22 where it is submitted to a thermal processing at a temperature T. For simplicity, assembly 20 is shown in simplified fashion in FIG. 2A, where protrusions 18 in particular have not been shown. A sintering occurs in furnace 22 and the obtained granules have an excellent mechanical strength.

The pressure exerted in the compression step of FIG. 2A may vary within a wide range of values, for example, from 100 bars (10 megapascals) to 10,000 bars (1 gigapascal). The temperature used in the thermal processing of FIG. 2B may also vary within a wide range of values. For example, it may be on the order of 1,000° C.

Generally, the higher the pressure in the compression step, the weaker the thermal anneal can be. The granules having undergone a high-temperature thermal processing exhibit a better mechanical strength.

It should however be noted that, since the powder consolidation starts at room temperature, it can be envisaged to obtain granules by mere cold compaction, that is, at room temperature, of the powders. It should however be noted that non-annealed granules are fragile and, unless they are handled with care, they risk crumbling away during their transportation to the melt.

It can also be envisaged not to compact the powders, and to bring assembly 20 in furnace 22 to a temperature that can reach the melting temperature of the material, 1,410° C. in the case of silicon. In this case, upper plate 14 is unnecessary. A priori, if support 1 is graphite, it will be avoided for the silicon to melt since the obtained granule may remain welded to support 1.

Figure 3:
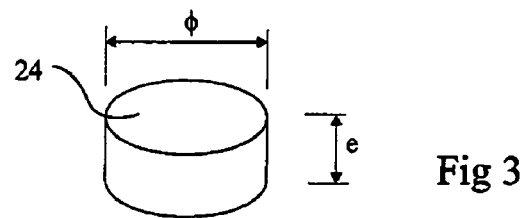
FIG. 3 shows a granule obtained according to the present invention.

FIG. 3 shows a granule 24 obtained by the method of FIG. 2. Granule 24 appears in the form of a cylindrical pellet of thickness e smaller than the thickness of mould 3 and of a diameter substantially equal to the diameter of openings 5 of mould 3. To give an idea, thickness e is from 1 to 3 millimeters and diameter Φ is on the order of from 1 to 5 mm.

If they have not been annealed up to the melting point, the granules obtained by the method of FIG. 2 exhibit a relatively high porosity, generally ranging between 20 and 40%. It is an interconnected porosity, also said to be an open porosity, that is to say, porosity channels are present throughout the entire granule and emerge outside. This feature may be taken advantage of in several ways, for example, for purification or doping.

Indeed, if the granules comprise impurities, for example, due to a pollution of the used silicon powders, the granules may be submitted to a subsequent thermal processing to have the impurities migrate to the outside of the granules via the porosity channels.

Also, a dopant gas may be flowed in a subsequent anneal to dope the granules. Since the gas uniformly spreads throughout the granule bulk due to its interconnected porosity, a homogenous doping of the granule is obtained across its bulk. Doped granules may also be doped by forming the granules from already doped semiconductor powders. It should be noted that the conventional granules generated in CVD reactors are not doped and that the fact of being able to easily dope the granules is an additional advantage of the present invention.

Figure 4:
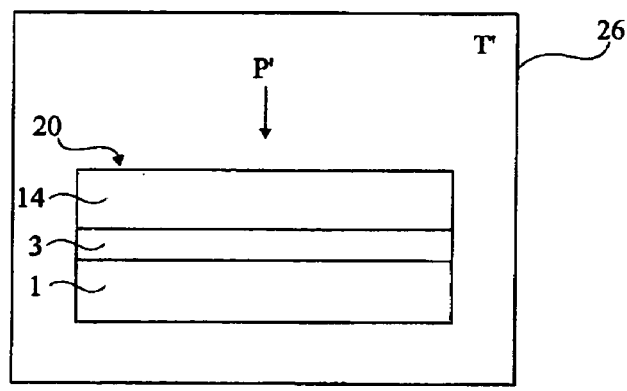
FIG. 4 illustrates another embodiment of the method according to the present invention.

FIG. 4 shows a variation of the method for manufacturing granules according to the present invention. Assembly 20, here again shown in simplified fashion and formed, as it should be reminded, of support 1, of mould 3 filled with silicon powders, and of plate 14, is placed in an enclosure 26, in which the silicon powders are submitted to a hot compaction step. For this purpose, a pressure P' is exerted between elements 1 and 14, while the assembly is submitted to a thermal processing at temperature T'. Pressure P' may be exerted for the entire duration of the thermal processing or only for a portion of this processing.

The method of FIG. 4 is remarkable in that the granules are almost immediately obtained. For example, when pressure P' is exerted for approximately 1 second and it is heated up to 1,200° C. for approximately 1 minute, granules with a very high mechanical strength are obtained rapidly and very economically. Further, pressure P' may be much lighter than pressure P of FIG. 2 to obtain granules substantially exhibiting the same mechanical strength. For example, a pressure P' smaller than 30 MPa (300 bars) is perfectly appropriate. Temperature T' may be on the order of magnitude of temperature T, for example, between 800° C. and the melting temperature of silicon (1,410° C.).

The granules obtained by the method of FIG. 4 are of the same type as the granules obtained by the method of FIG. 2. However, their porosity is generally smaller, for example, 10% or less. If the advantages linked to a high porosity of the granules are desired to be kept, it must be ascertained for it not to be too small.

The size of the obtained granules is not critical. It is enough for the granules to be big enough to be able to feed the melts where the silicon ingots are produced. In practice, it is enough for their size to be millimetric, for example, on the order of from one to a few millimeters. If need be, granules of larger dimension may be obtained by mere increase in the size of openings 5 of mould 3.

The shape of the obtained granules is not critical. Although cylindrical granules have been shown, the granules may be in the shape of cubes, of rectangle parallelepipeds, or other, according to the shape of openings 5 of mould 3. The granules may for example be elongated, bar-shaped, thread-shaped, etc.

The used powders may be nanometric powders, for example, of a diameter on the order of 20 nm, micrometric powders, millimetric powders, or a mixture of powders of various granulometries.

The reaction atmosphere in furnace 22 or enclosure 26 may be vacuum or a controlled pressure of a gas, inert or not, for example, argon, nitrogen, or chlorine. A gas which contains a vapor pressure of an element other than silicon, for example, of another semiconductor, or of a silicon dopant such as boron, phosphorus, or arsenic, may also be used.

Of course, the present invention is likely to have various alterations and modifications which will occur to those skilled in the art.

In particular, it should be noted that the various elements described in relation with FIGS. 1A to IF are examples only and may undergo many modifications.

For example, plate 14 may exhibit no protrusions 18 if the material forming mould 3 is flexible and/or deformable enough for the powder islets that it encloses to be adequately compressed.

Mould 3 may also be avoided. For example, small powder piles may be placed in spaced fashion on a support. A plate is placed on the assembly, which is submitted to the method of FIG. 2 or 4. The small powder piles are crushed by the compression and, if they are distant enough from one another, they will form separated granules.

It should also be noted that it is possible to use not a single mould 3, but several adequately superposed and separated moulds 3. For example, a stacking formed of a support 1, of a mould 3 filed with silicon powders, of a plate 14, followed by another mould 3 filled with silicon powders, of another plate 14, etc. to form many granules at the same time, may be formed.

The powders used to form the granules may be formed of a mixture of powders of granulometries adapted to a desired compactness. It should also be noted that the method according to the present invention enables manufacturing silicon granules, as described, but also granules of another semiconductor material, such as germanium, or of an alloy, such as gallium arsenide or an alloy of silicon, germanium, and carbon.

The invention claimed is:

1. A method for manufacturing semiconductor granules intended to feed a semiconductor material manufacturing melt, said method comprising:
    sintering powders of at least one material selected from the group consisting of silicon, germanium, gallium arsenide, and the alloys thereof so as to form said granules, said sintering step comprising the steps of compacting and thermal processing said powders,
    wherein, the step of sintering comprises a compaction step followed with a thermal processing step, and
    wherein the pressure of the compaction step ranges between 10 MPa and 1 GPa.

2. A method for manufacturing semiconductor granules intended to feed a semiconductor material manufacturing melt, said method comprising:
    sintering powders of at least one material selected from the group consisting of silicon, germanium, gallium arsenide, and the alloys thereof so as to form said granules, said sintering step comprising the steps of compacting and thermal processing said powders,
    wherein said compacting and thermal processing steps are performed at the same time defining a hot pressing step.

3. The method of claim 2, wherein, in the hot pressing step, the pressure is lower than 100 MPa and the temperature is greater than 800° C.

4. A method for manufacturing semiconductor granules intended to feed a semiconductor material manufacturing melt, said method comprising:
    sintering powders of at least one material selected from the group consisting of silicon, germanium, gallium arsenide, and the alloys thereof so as to form said granules, said sintering step comprising the steps of compacting and thermal processing said powders,
    wherein the powders are doped semiconductor powders.

5. A method for manufacturing semiconductor granules intended to feed a semiconductor material manufacturing melt, said method comprising:
    sintering powders of at least one material selected from the group consisting of silicon, germanium, gallium arsenide, and the alloys thereof so as to form said granules, said sintering step comprising the steps of compacting and thermal processing said powders; and
    annealing or doping of the granules.

6. A method for manufacturing semiconductor granules intended to feed a semiconductor material manufacturing melt, said method comprising:
    sintering powders of at least one material selected from the group consisting of silicon, germanium, gallium arsenide, and the alloys thereof so as to form said granules, said sintering step comprising the steps of compacting and thermal processing said powders,
    wherein said granules have a porosity ranging between about 20% and about 40%.

* * * * *